(12) United States Patent
Kratochvil et al.

(10) Patent No.: US 9,709,623 B2
(45) Date of Patent: Jul. 18, 2017

(54) APPARATUS AND METHOD FOR MONITORING A PHOTOVOLTAIC SYSTEM

(71) Applicant: SMA Solar Technology AG, Niestetal (DE)

(72) Inventors: Marcel Kratochvil, Kassel (DE); Sebastian Bieniek, Niestetal (DE); Holger Behrends, Kassel (DE); Markus Hopf, Espenau (DE)

(73) Assignee: SMA Solar Technology AG, Niestetal (DE)

( * ) Notice: Subject to any disclaimer, the term of this patent is extended or adjusted under 35 U.S.C. 154(b) by 1207 days.

(21) Appl. No.: 13/741,534

(22) Filed: Jan. 15, 2013

(65) Prior Publication Data
US 2013/0141133 A1 Jun. 6, 2013

Related U.S. Application Data

(63) Continuation of application No. PCT/EP2011/062357, filed on Jul. 19, 2011.

(30) Foreign Application Priority Data

Jul. 20, 2010 (DE) .......................... 102010036514.9

(51) Int. Cl.
*G01R 31/14* (2006.01)
*G01R 31/02* (2006.01)
(Continued)

(52) U.S. Cl.
CPC .... *G01R 31/2605* (2013.01); *H01L 31/02021* (2013.01); *H02S 50/10* (2014.12); *Y02E 10/50* (2013.01)

(58) Field of Classification Search
CPC ................ G01R 31/2605; H02S 50/10; H01L 31/02021; Y02E 10/50
(Continued)

(56) References Cited

U.S. PATENT DOCUMENTS

| 3,431,487 A | 3/1969 | Savage |
| 2010/0060186 A1 | 3/2010 | Taipale et al. |
| 2010/0292853 A1* | 11/2010 | McDonnell ............... H02J 3/34 700/287 |

FOREIGN PATENT DOCUMENTS

| DE | 102006052295 B3 | 6/2008 |
| EP | 1918727 A1 | 5/2008 |
| WO | 0210782 A2 | 7/2001 |

OTHER PUBLICATIONS

International Search Report dated Nov. 22, 2011 for application No. PCT/EP2011/062357.
(Continued)

*Primary Examiner* — Farhana Hoque
(74) *Attorney, Agent, or Firm* — Eschweiler & Potashnik, LLC

(57) ABSTRACT

The apparatus for monitoring a photovoltaic system includes an incoupling circuit configured to couple an AC voltage test signal into the photovoltaic system, and an outcoupling circuit configured to outcouple a response signal, which is associated with the test signal, from the photovoltaic system, and an evaluation device, which is connected to the outcoupling circuit. The evaluation device is configured to identify events which adversely affect correct operation of the photovoltaic system. The apparatus is distinguished in that the outcoupling circuit includes a first transformer and a second transformer, each having a respective primary winding and each having a respective secondary winding which is connected to the evaluation device, with the primary windings of the first and second transformers being arranged in different electrical lines between a generator and an inverter in the photovoltaic system. The disclosure also relates to a corresponding method for monitoring a photovoltaic system.

8 Claims, 5 Drawing Sheets

(51) Int. Cl.
  *G05D 3/12*   (2006.01)
  *G01R 31/26*  (2014.01)
  *H01L 31/02*  (2006.01)
  *H02S 50/10*  (2014.01)

(58) Field of Classification Search
  USPC .................... 324/761.01, 509, 537; 700/287
  See application file for complete search history.

(56) References Cited

OTHER PUBLICATIONS

Qiu Xiaohue, et al.; "Compensation for Current Probe Measurement Applied in Conductive Electromagnetic Interference (EMI) Noise Soft Separation"; Microwave and Millimeter Wave Technology (ICMMT), 2010 International Conference on IEEE, Piscataway, NJ, May 8, 2010, p. 2025-2028.

Paul C R, et al.; "Diagnosis and Reduction of Conducted Noise Emissions"; Session 2A, Aug. 2, 1988, p. 19-23.

* cited by examiner

APPARATUS AND METHOD FOR MONITORING A PHOTOVOLTAIC SYSTEM

REFERENCE TO RELATED APPLICATIONS

The present application is a continuation application of International Patent Application No. PCT/EP2011/062357, filed on Jul. 19, 2011, which claims priority to German Patent Application No. DE 10 2010 036514.9, filed on Jul. 20, 2010, the contents of which are hereby incorporated by reference in their entirety.

FIELD

The disclosure relates to an apparatus and a method for monitoring a photovoltaic system for identification of events such as contact faults which adversely affect correct operation of the device.

BACKGROUND

In a photovoltaic system, a photovoltaic generator, formed from one or more photovoltaic modules, provides electrical energy by means of photovoltaic conversion. In order to ensure correct operation, it is necessary to monitor photovoltaic systems, in order to identify the occurrence of events that adversely affect correct operation of the device.

By way of example, events that adversely affect device operation may include theft of one or more components of a photovoltaic system, destruction of one or more components of a photovoltaic system, change in the conductivity of one or more electrical connections of a photovoltaic system (for example contact aging and/or a contact fault), deterioration of the efficiency of one or more photovoltaic modules (degradation), installation faults, for example faulty connection of one or more components during the installation of a photovoltaic system, and/or shadowing, for example shadowing of one or more photovoltaic modules of a photovoltaic system.

The above list of events that can adversely affect correct operation of a photovoltaic system does not claim to be complete, and in fact represents a choice of examples of events which can adversely affect correct operation of a photovoltaic system.

For example, high electric currents can occur during operation of the photovoltaic systems which, in some circumstances, can lead to considerable power losses by interacting with defective and/or damaged components. This relates in particular to contact resistances of contacts of connecting points of modules to one another and electrical line connections. Contact faults are evident, inter alia, by an increase in the contact resistance of the relevant electrical connection.

DE 10 2006 052 295 B3 describes a method and a circuit arrangement for monitoring a photovoltaic generator, specifying a fundamental principle for generator diagnosis with signal input and measurement between a photovoltaic generator and an inverter.

The known method is sensitive to incoupled disturbing signals, which can negatively influence the accuracy of required measurements. Interference such as this can be incoupled into the photovoltaic system from external components—which are not functionally related to the photovoltaic system—for example a source of electromagnetic radiation, or may be caused by components of the photovoltaic system itself, for example an inverter.

SUMMARY

Against this background, the disclosure provides an apparatus and a method as recited in the independent claims. Advantageous embodiments are described in the respective dependent claims.

The apparatus for monitoring a photovoltaic system comprises incoupling means for coupling an AC voltage test signal into the photovoltaic system, outcoupling means for outcoupling a response signal, which is associated with the test signal, from the photovoltaic system, and an evaluation device, which is connected to the outcoupling means, for identification of events which adversely affect correct operation of the photovoltaic system.

The apparatus is distinguished in that the outcoupling means has a first transformer and a second transformer, each having a respective primary winding and each having a respective secondary winding which is connected to the evaluation device, with the primary windings of the first and second transformers being arranged in different electrical lines between a generator and an inverter in the photovoltaic system.

Interference influences are applied to the different lines between the generator and the inverter in common mode (push-push mode), while the AC voltage test signal which is introduced from the incoupling means is applied to the different lines in differential mode (push-pull mode). The test signal and the disturbing interference influences are recorded twice by the differently arranged transformers, with the phase relationships in the different lines accordingly being different, however, for the test signal and the interference influences. This makes it possible to separate the interference influences from the test signal, as a result of which the monitoring of the photovoltaic system is made less sensitive to interference influences, in a simple manner.

According to one advantageous refinement, the secondary windings of the first and second transformers are connected in series in opposite senses, and are jointly connected to the evaluation device. The response signals from the test signal are added in this manner, which can be implemented in a simple form while, in contrast, the interference influences cancel one another out, or are at least reduced.

According to further advantageous refinements, the secondary windings of the first and second transformers are separately connected to the evaluation device, and the evaluation device combines response signals from the first transformer and from the second transformer in an analog or digital manner. This also results in a combination of the response signals in which the interference influences are reduced in comparison to the test signal. One advantage of these refinements is that signal processing and/or preprocessing can be carried out before the combination of the response signals.

According to a further advantageous refinement, the apparatus is integrated in the inverter, as a result of which it is inserted into the photovoltaic system without major additional complexity.

The method for monitoring a photovoltaic system for identification of events which adversely affect the correct operation of the photovoltaic system such as contact faults includes the following method acts. An AC voltage test signal is input into the photovoltaic system and response signals that are associated with the test signal are outcoupled from different electrical lines between a generator and an inverter in the photovoltaic system. The outcoupled response signals are combined to form a joint response signal in order to reduce any disturbing signal component, and the photovoltaic system is monitored by evaluation of the joint response signal.

The advantages stated above in conjunction with the apparatus likewise apply to the method.

According to one advantageous refinement, the frequency of the input signal is varied. According to a further advantageous refinement, an evaluation of the response signal may includes the following acts: amplification of the response signal, for example, by a non-inverting amplifier, filtering of the response signal, for example, by a high-pass filter, filtering of the response signal, for example, by an RC low-pass filter, and rectification of the response signal. These measures achieve particularly good suppression of interference influences in comparison to the test signal.

Before describing preferred example embodiments, it should be noted that a number of refinements are also described in detail in the following text, but that the disclosure is not restricted to these refinements, but may be varied as required within the scope of the claims. In particular, terms such as "top", and "bottom", and "front" or "rear" should not be understood in a restrictive sense, but relate only to the respectively described arrangement. Furthermore, when individual components are explained, these are also in principle feasible in a multiple form—unless mentioned to the contrary. Furthermore, the scope of protection also covers functional reversals—for example kinematic reversals and the like—of the described arrangements and methods, as well as equivalent forms.

BRIEF DESCRIPTION OF THE DRAWINGS

The disclosure will be described in more detail in the following text with reference to the attached drawings, in which:

FIG. 4a shows a schematic illustration of a coil in the magnetic field of influence of an electrical conductor, in order to explain details according to the disclosure;

FIG. 4b shows an example of an electrical equivalent circuit of the illustration in FIG. 4a.

DETAILED DESCRIPTION

Figure 1:
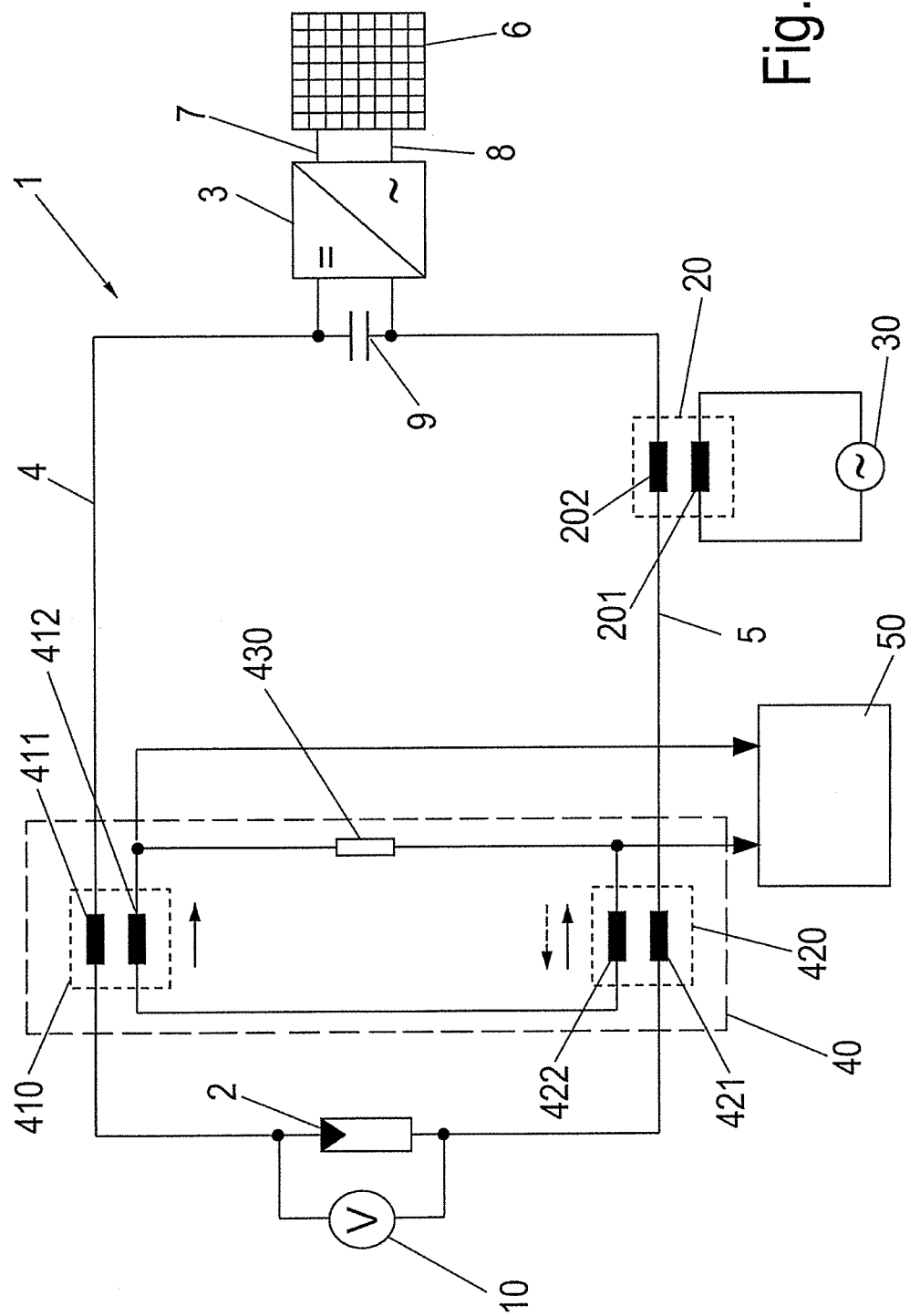
FIG. 1 shows a schematic illustration, like a circuit diagram, of a photovoltaic system.

FIG. 1 shows a photovoltaic system 1 to be monitored. This photovoltaic system 1 has a photovoltaic generator 2, which in turn comprises a number of, for example two, photovoltaic modules which are not illustrated.

A positive DC voltage output of the photovoltaic generator 2 is connected via an electrical line 4 to a positive DC voltage input of an inverter 3. A negative DC voltage output of the photovoltaic generator 2 is connected via an electrical line 5 to a negative DC voltage input of the inverter 3. The lines 4, 5 are considered to run continuously from the photovoltaic generator 2 to the inverter 3, irrespective of whether an inductance is included in this line.

The inverter 3 is designed to convert electrical power produced by the photovoltaic generator 2 such that it can be fed into an electrical grid system, for example into the public power supply grid system 6. For this purpose, the inverter 3 is connected via electrical lines 7, 8 to the power supply grid system 6.

The illustration also shows an inverter equivalent capacitance 9. The method of operation of this capacitance 9 will be explained in more detail later.

Furthermore, the photovoltaic system 1 has a signal generator 30 which comprises a test signal generator, for example with a digital signal processor, for production of a suitable test signal at a variable or varying frequency. A test signal produced in this way is amplified via a power section (amplifier, driver)—corresponding to the requirements of the photovoltaic system 1—and is input via an incoupling means 20, for example a transformer, into the direct-current circuit of the photovoltaic system 1.

The incoupling means, which is in the form of a transformer, for this purpose has a primary winding 201 and a secondary winding 202. The primary winding 201 is connected to the signal generator 30. The secondary winding 202 is included in the direct-current circuit of the photovoltaic system 1, and the current on the electrical line 5 flows through it.

The incoupling means 20 is in this case designed such that the EMC characteristics (characteristics which relate to the electromagnetic compatibility) and the performance of the photovoltaic system 1 are not influenced, or are influenced as little as possible. By way of example, when the incoupling means 20 is in the form of a transformer, this transformer is for this purpose designed such that it does not enter a saturation state even when large direct currents flow through its secondary winding 202—for example during the daytime.

The photovoltaic system 1 has an outcoupling means 40 in order to outcouple a signal response from the photovoltaic generator 2 to the input test signal. The outcoupling means 40 comprises a first transformer 410 with a primary winding 411 and a secondary winding 412, as well as a second transformer 420 with a primary winding 421 and a secondary winding 422. The primary winding 411 of the first transformer 410 is in this case included in the line 4, and the primary winding 421 of the second transformer 420 is included in the line 5 between the photovoltaic generator 2 and the inverter 3. The transformers 410, 420 may each have a core, around which the primary and secondary windings 411, 412, 421, 422 are passed. Alternatively, it is also possible to use a conductor track, for example on a board, as the primary winding 411 or 421, with a coil, which is arranged in the magnetic area of influence of the conductor track on the board, being used as the respective secondary winding 412 or 422. In this sense, any arrangement which results in a signal output via inductive interaction, can be considered to be a transformer.

An alternating current flowing through the electrical lines 4 and 5 induces an AC voltage in the secondary windings 412 and 422, the magnitude of which AC voltage is proportional to the alternating current flowing in the electrical lines 4, 5. The secondary windings 412 and 422 are connected in opposite senses in series. A resistor 430 is connected in parallel with the series circuit comprising the secondary windings 412 and 422. The voltage across the resistor 430 is passed on to the evaluation device 50. It is likewise possible to pass on the output signal from the secondary windings 412, 422 in a different manner than by means of a resistor, for example by means of active integration of the signal, to the evaluation device 50.

The illustrated circuit arrangement ensures effective protection of the evaluation of the signal response against any influence from common-mode interference. Common-mode interference means, for example, capacitively input interference voltages and currents on connecting lines—in this case the lines 4 and 5—between the photovoltaic generator 2 and the inverter 3, which interference propagates on both lines 4, 5 with the same phase angle and in the same current direction.

Such interference may be caused by the photovoltaic system 1 itself or by its components, for example by the inverter 3. It is likewise possible for interference such as this to be input into the photovoltaic system 1 from the outside.

In other words, interference which is input, for example capacitively, into the photovoltaic system 1 leads to an interference current flow in the line 4 in the direction of the photovoltaic generator 2 to the inverter 3, which is symbolized in FIG. 1 by an arrow with a solid line, which is shown under the secondary winding 412 of the first transformer 410. The same interference likewise leads to an interference current flow in the line 5 from the photovoltaic generator 2 to the inverter 4, once again illustrated by an arrow with a solid line (shown above the secondary winding 422 of the second transformer 420).

The chosen series connection in opposite senses results in the voltages canceling one another out, provided they have the same magnitude and are in phase. Input common-mode interference is effectively suppressed, and/or at least substantially reduced, in this way.

In contrast, however, the test signal which is input via the incoupling means 20 leads to antiphase signal components in the outcoupled signals. If the signal component of the test signal which is output from the first transformer 410 is likewise aligned in an instantaneous record as is indicated by the solid arrow below the first transformer 410, the signal component which is output from the second transformer 420 is aligned in the opposite sense, as is symbolized in FIG. 1 by the dashed arrow above the second transformer 420. Antiphase signal components such as these are added on the resistor 430. In contrast to the input common-mode interference, the signal components which result from the test signal are even also amplified by a factor of two.

If the circuit comprising the secondary winding 202 of the incoupling means 20, the photovoltaic generator 2, the lines 4, 5 and the inverter 3 is considered purely in AC voltage terms, then a further advantage of the chosen circuit for the outcoupling means 40 becomes clear.

When considered from the AC voltage point of view, the secondary winding 202 can be considered to be an AC voltage source, while the photovoltaic generator 2 can be represented by a frequency-dependent impedance Z(f). An alternating current is produced which flows through the line 5, through the inverter 3, to be precise through the inverter equivalent capacitance 9, through the line 4, through the photovoltaic generator 2 and back via the line 5 to the secondary winding 202. This alternating current, which is initiated by the "voltage source" of the secondary winding 202, depends not only on the parameters of the secondary winding 202 itself but also significantly on the impedance Z(f) of the photovoltaic generator 2, and therefore represents a signal response to the stimulus by a test signal (fed in by means of the secondary winding 202). The alternating current described above induces antiphase AC voltages in the secondary windings 412 and 422, which are added in the case of the chosen series circuit.

If it is also intended to monitor the photovoltaic system 1 when an inverter 3 is switched off (for example at night, or when there is insufficient input radiation to the photovoltaic generator 2), the inverter equivalent capacitance 9 closes the AC circuit in a situation such as this. Even if the inverter 3 is completely disconnected from the photovoltaic system 1, an alternating current can therefore flow via the inverter equivalent capacitance 9, and the photovoltaic system 1 can be monitored. If required, the inverter equivalent capacitance 9 can be designed to be switchable, such that it can be switched to be active only when the capacitance (not illustrated) of the inverter 3 is not available.

For signal preprocessing of the signal at the input of the evaluation device 50, the evaluation device 50 may, inter alia, have known components, which are not illustrated in detail, for example a possibly active high-pass filter, a low-pass filter, a controllable amplifier and a rectifier. Preprocessing can be carried out here before being passed on for further processing to a component which is not illustrated here, for example to a superordinate control device. A voltage, detected by a voltmeter 10, on the photovoltaic generator 2 can also be processed during processing such as this.

Figure 5:
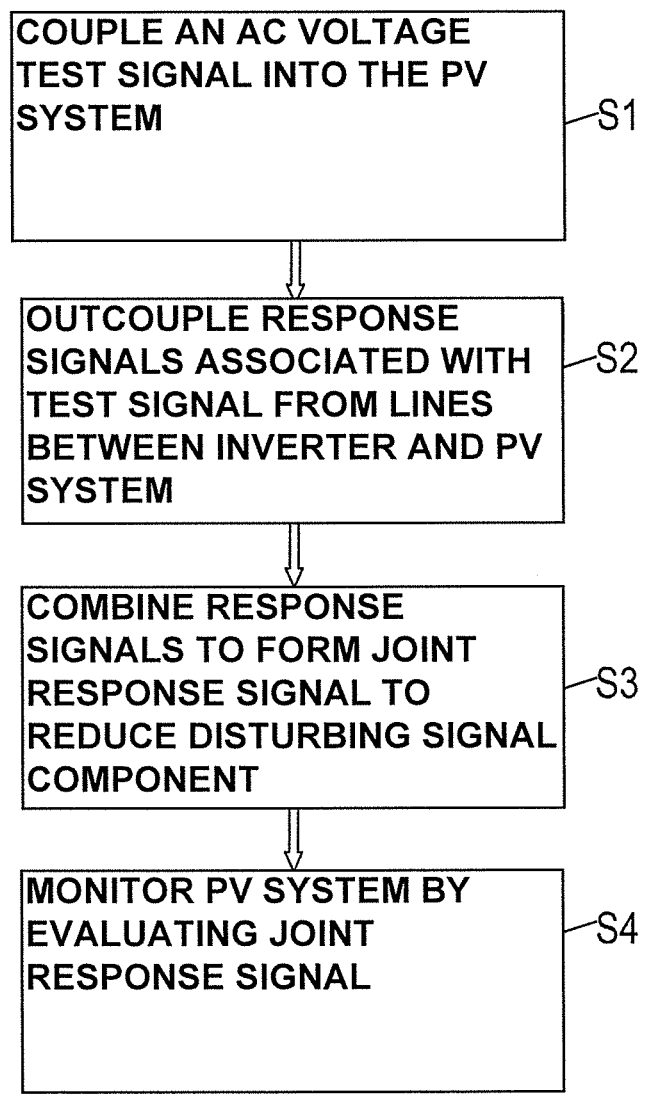
FIG. 5 shows a flowchart in order to illustrate a method process according to the disclosure.

A refinement of the method illustrated in FIG. 5 is therefore created, which comprises coupling an AC voltage test signal into the photovoltaic system 1 at S1, and outcoupling response signals, which are associated with the test signal, from different electrical lines 4, 5 between a generator 2 and an inverter 3 in the photovoltaic system 1 at S2. The method further comprises combining the output response signals to form a joint response signal in order to reduce any disturbing signal component at S3, and monitoring the photovoltaic system 1 by evaluating the joint response signal at S4.

In particular, at S4, contacts of the photovoltaic system are monitored by evaluation of the response signal. For example, this allows a faulty contact to be identified, without having to disconnect the electrical connections of the photovoltaic system, with the aid of a test signal which is input into the electrical elements of the photovoltaic system and is outcoupled from it again in the form of a response signal. For this purpose, the behavior of the photovoltaic system is recorded over a certain time period, for example, and suitable parameters which characterize "normal operation" without any faults are stored. During this process, the frequency of the test signal may be varied, thus also making it possible to distinguish the test signal from an disturbing signal, in addition to act S3.

Discrepancies of the determined parameters indicate possible fault states. By way of example, one parameter of this type may be the impedance behavior of the system.

FIG. 2 once again shows a photovoltaic system 1 to be monitored, which corresponds essentially to the photovoltaic system shown in FIG. 1. In these and all the further figures, the same reference symbols denote the same elements, or elements having the same effect, as in FIG. 1.

In contrast to the photovoltaic system shown in FIG. 1, the photovoltaic generator 2 is in this case split into two groups 2a and 2b with a number of photovoltaic modules. Each of the groups 2a, 2b may have a number of photovoltaic modules which, for example, can be connected in series and can each form a so-called string. In addition, the number of groups is not restricted to two. For example, one photovoltaic generator 2 may have a multiplicity of groups, which are in the form of strings and/or a functional unit, connected in a different manner, of a number of photovoltaic modules.

The groups of photovoltaic modules 2a and 2b are connected in parallel to the inverter 3 via lines 4 and 5. Each group has its own associated outcoupling means 40a, 40b. In general, in the context of FIG. 2, the use of the indices a or b with a reference symbol indicates the association with the corresponding group of photovoltaic modules 2a and 2b. Elements which are provided only once, that is to say not separately for each of the groups, have no such index.

The outcoupling means 40a and 40b respectively associated with the groups 2a and 2b are designed in a corresponding manner to the outcoupling means 40 from the exemplary embodiment shown in FIG. 1. In this case, the outcoupling means 40a, 40b are connected directly to the respective groups of photovoltaic modules 2a and 2b. The parallel connection is made (from the view of the photovoltaic modules) only downstream from the outcoupling means 40a, 40b.

A voltage which represents a signal response from the corresponding group to a stimulus with a test signal by a signal generator 30 is dropped across the resistors 430a and 430b, in the manner already described in conjunction with the photovoltaic system 1 illustrated in FIG. 1. This voltage is passed on to corresponding evaluation devices 50a, 50b, where it is preprocessed and processed further, as likewise already described. As has likewise already been stated, a voltage which is measured by a voltmeter 10a or 10b on the respective groups of photovoltaic modules 2a and 2b is also used in the further processing.

In contrast to the outcoupling means, there is only one incoupling means 20 in the present example embodiment. Here, it is connected via a capacitor 203 to the photovoltaic device 1. In addition, blocking inductances 204 and 205 are provided in order to decouple the inverter 3 from the other system components. In this case, the inverter equivalent capacitance 9 (cf. FIG. 1) is omitted from the embodiment with an inductive input, because the circuit is not closed via the inverter.

Figure 2:
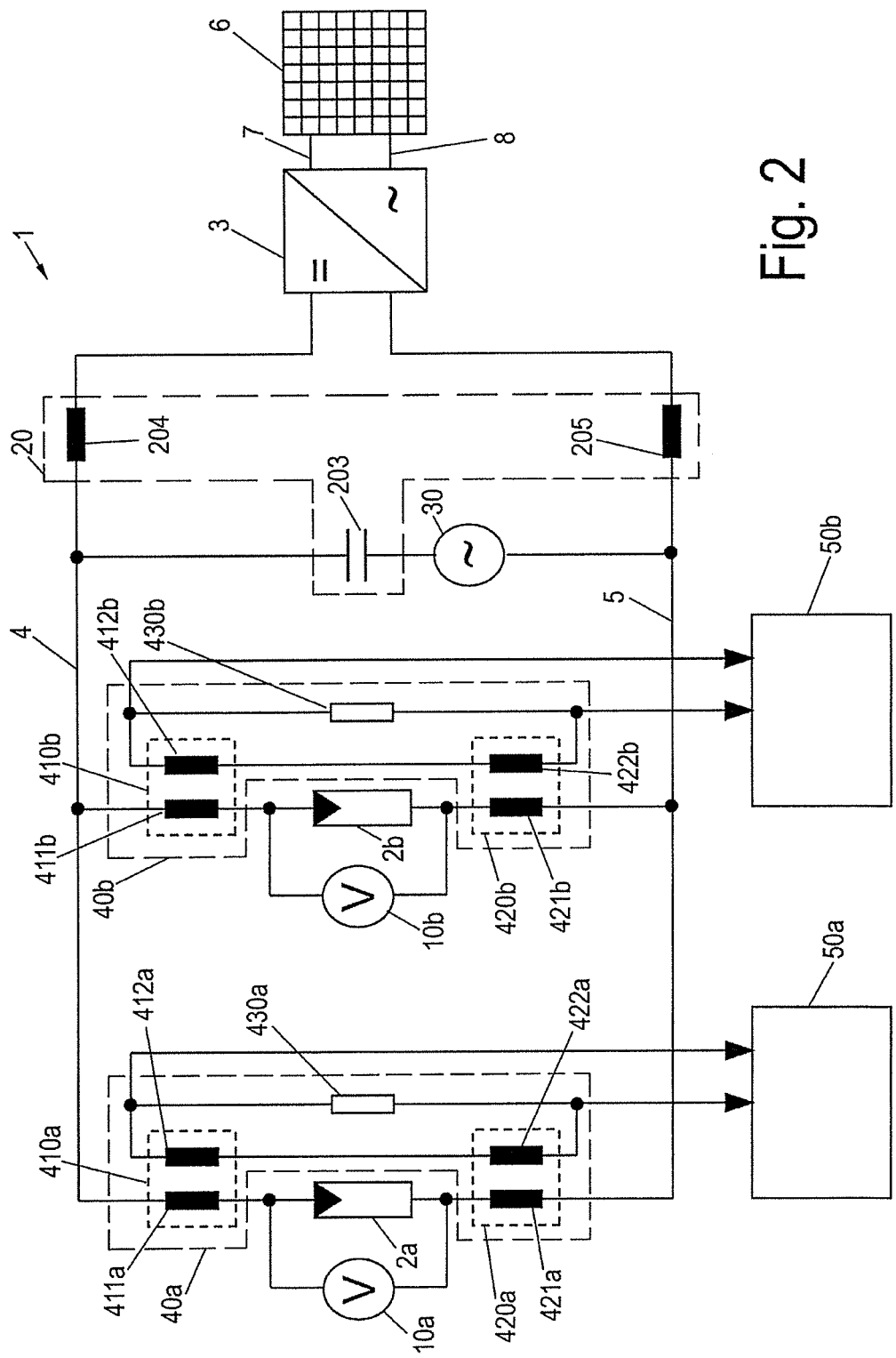
FIG. 2 shows a schematic illustration, like a circuit diagram, of a second photovoltaic system.

One specific feature for the example embodiment illustrated in FIG. 2 is that a separate outcoupling means 40a and 40b is provided for each group of photovoltaic modules 2a, 2b (that is to say, as shown, for each string). The method of operation of the respective outcoupling means 40a and 40b associated with a group corresponds to that of the described outcoupling means 40, as illustrated in FIG. 1.

This allows each group of photovoltaic modules 2a, 2b in the photovoltaic system to be monitored separately. When an event which has an adverse effect is found, for example a contact interruption, this can be immediately associated with one specific string. This advantageously simplifies fault tracing.

Furthermore, a separate evaluation device 50a and 50b is associated with each group of photovoltaic modules 2a, 2b and each outcoupling means 40a, 40b. It is also feasible to equip an evaluation device (which is not shown) with a multiplexing device (which is not shown) which, for one time period in each case, pass on the signals recorded by the outcoupling means 40a and 40b to this single evaluation device.

FIG. 3 once again shows a photovoltaic system 1 to be monitored. As in the case of the example embodiment in FIG. 1, the photovoltaic generator 2 in this case once again has only one group with a number of photovoltaic modules. However, an embodiment analogous to FIG. 2 with a plurality of separately monitored groups is likewise feasible.

Figure 3:
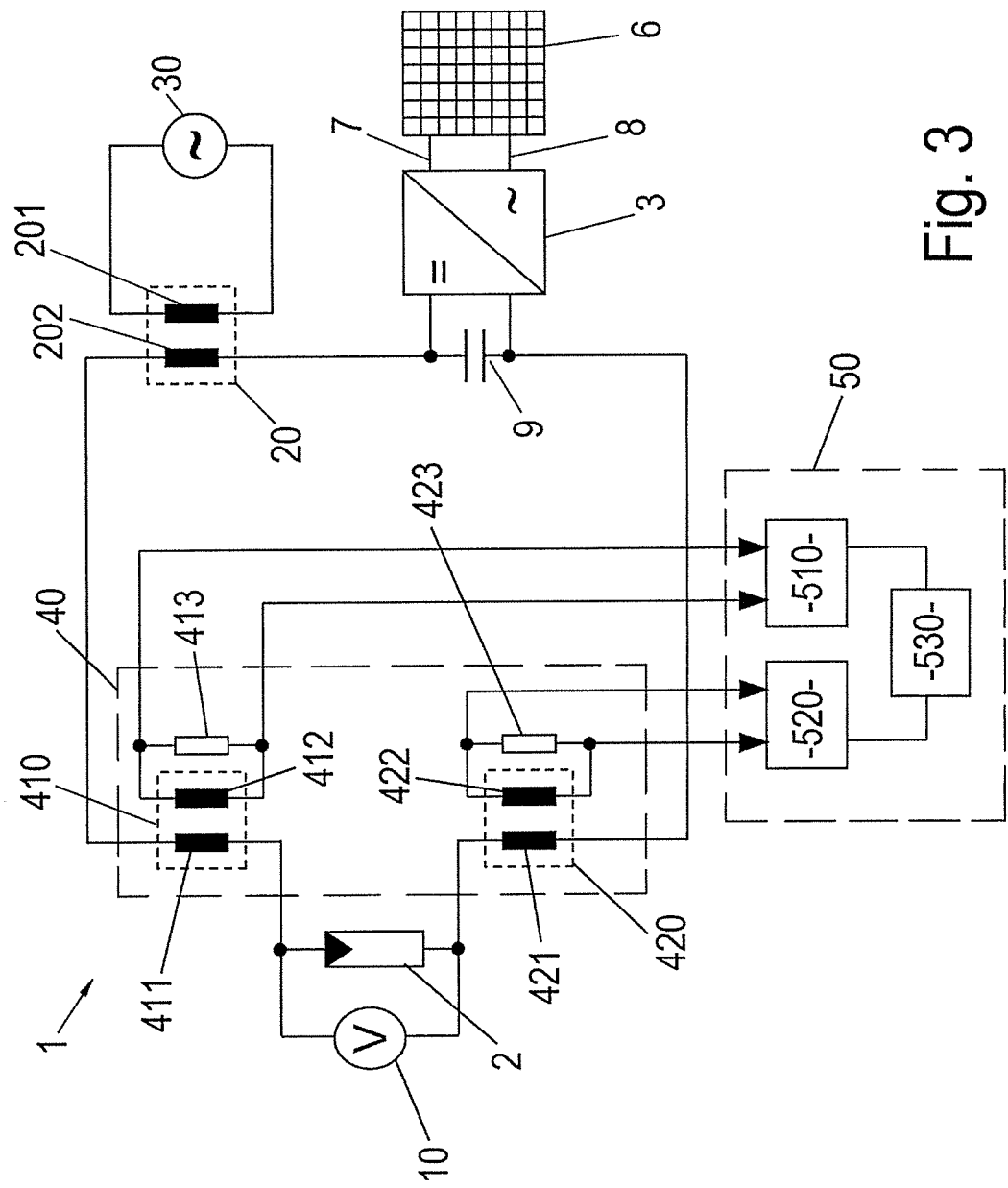
FIG. 3 shows a schematic illustration, like a circuit diagram, of a third photovoltaic system.

In the example embodiment illustrated in FIG. 3, the outcoupled signals are separately recorded and evaluated, that is to say addition or subtraction is not carried out by the secondary windings 412 and 422 (as well as 412a, 422a and 412b, 422b) connected in series, as in the two example embodiments described above (cf. FIG. 1 and FIG. 2). Instead of this, the two output lines of the secondary windings 412 and 422 are separately provided with parallel-connected resistors 413, 423, and are connected to separate evaluation units 510, 520 in the evaluation device 50. Finally, the two outcoupled signals are then linked in an analog or digital manner in a processing unit 530 in the evaluation device 50.

In other words, common-mode suppression (that is to say suppression of common-mode interference) is achieved in the example embodiments shown in FIGS. 1 and 2 by means of a chosen circuit variant within the outcoupling means 40, 40a, 40b, while common-mode suppression is achieved in the example embodiment being described at the moment by addition of voltage elements within the evaluation unit 50.

Figures 4A, 4B:
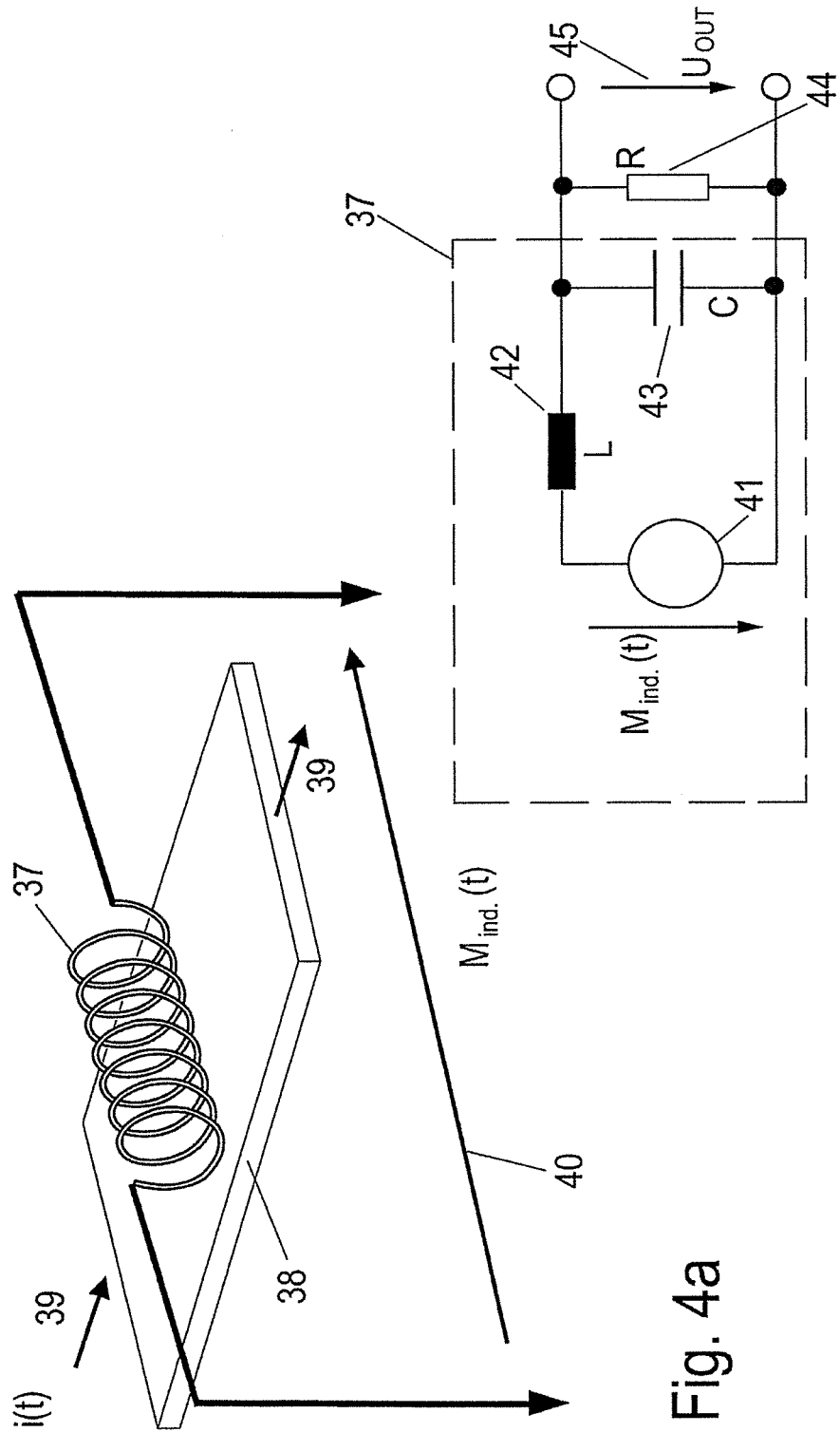

FIG. 4a shows a schematic arrangement of a coil 37 in the magnetic area of influence of an electrical line 38, for example a conductor track on a board which is not illustrated. The coil 37 and the electrical line 38 are not galvanically connected to one another. The coil 37 may be held on the board by suitable means (which are not illustrated). When an alternating current 39 i(t) flows through the conductor 38, this induces an AC voltage 40 $U_{ind}(t)$, which is proportional to the change in the alternating current i(t), in the coil 37.

FIG. 4b shows an electrical equivalent circuit of the arrangement shown in FIG. 4a. This figure shows an ideal voltage source 41, which produces the voltage $M_{ind}(t)$. The figure also shows a coil inductance 42 and a loss capacitance 43 of the coil. The connection of the "real" coil 37 to a parallel resistor 44 results in a low-pass filter. The output signal 45 $U_{OUT}$ which is produced represents the integration of the voltage $M_{ind}(t)$ in a specific frequency range, and is proportional to the current i(t) in this frequency range (cf. FIG. 4a). This allows a current measurement to be carried out on a signal response, as is required for the outcoupling means described above.

By way of example, a signal which has been output in this way, for example the output signal 45 $U_{OUT}$, can be preprocessed by amplifying the response signal using a non-inverting amplifier, for example with a gain factor of six, and filtering the response signal using a high-pass filter, for example, using a fourth-order high-pass filter with a cut-off frequency of 100 kHz, and a gain of twenty five. Further, the preprocessing may comprise filtering the response signal using an RC low-pass filter, for example, using an RC low-pass filter with a cut-off frequency of 2.1 MHz, and rectifying the response signal, for example, using a half-wave rectifier.

The constraints in the acts described above for signal preprocessing should, in one embodiment, be matched to the respective circumstances, for example to an interference spectrum radiated from an inverter, etc.

The disclosure is not restricted to the described example embodiments, and can be modified in many ways. In particular, it is possible to implement said features in combinations other than those mentioned.

The disclosure can also be applied to individual photovoltaic modules, in which case an individual photovoltaic module having a number of photovoltaic cells can be split into groups (of cells). The present disclosure can then likewise be applied to these groups.

Non-reactive resistors can likewise be used as outcoupling means for measurement of currents (so-called "shunts"). Any possibly necessary matching of the associated circuit elements is then required, in one embodiment.

The invention claimed is:

1. An apparatus for monitoring a photovoltaic system, comprising:

an incoupling circuit to couple an AC voltage test signal into the photovoltaic system when coupled thereto, an outcoupling circuit to outcouple a response signal, which is associated with the test signal, from the photovoltaic system, and an evaluation device, which is connected to the outcoupling circuit, to identify events which adversely affect correct operation of the photovoltaic system, wherein the outcoupling circuit comprises a first transformer and a second transformer, each having a respective primary winding, and each having a respective secondary winding which is connected to the evaluation device, wherein the primary windings of the first and second transformers are arranged in different electrical lines, and are between a generator and an inverter of the photovoltaic system.

2. The apparatus as claimed in claim 1, wherein the secondary windings of the first and second transformers are connected in series in opposite senses, and are jointly connected to the evaluation device.

3. The apparatus as claimed in claim 1, wherein the secondary windings of the first and second transformers are separately connected to the evaluation device.

4. The apparatus as claimed in claim 3, wherein the evaluation device combines response signals from the first transformer and from the second transformer in an analog manner.

5. The apparatus as claimed in claim 3, wherein the evaluation device combines response signals from the first transformer and from the second transformer in a digital manner.

6. The apparatus as claimed in claim 1, wherein the photovoltaic system comprises a plurality of parallel-connected generators, wherein a corresponding outcoupling circuit is associated with each of the parallel-connected generators.

7. The apparatus as claimed in claim 1, wherein the test signal is at a variable frequency.

8. The apparatus as claimed in claim 1, wherein the apparatus is integrated in the inverter.

* * * * *